(12) United States Patent
Lewis et al.

(10) Patent No.: US 7,264,675 B1
(45) Date of Patent: Sep. 4, 2007

(54) DIAMOND MANUFACTURING METHOD

(76) Inventors: Richard L Lewis, 101 Carpenter Ave., C1, Mt. Kisco, NY (US) 10549; Leon Zakinov, 101 Carpenter Ave., C1, Mt. Kisco, NY (US) 10549

(*) Notice: Subject to any disclaimer, the term of this patent is extended or adjusted under 35 U.S.C. 154(b) by 274 days.

(21) Appl. No.: 11/150,071

(22) Filed: Jun. 10, 2005

(51) Int. Cl.
*C30B 29/04* (2006.01)

(52) U.S. Cl. ............... 117/79; 117/73; 117/74; 117/75; 117/76; 117/929; 423/446

(58) Field of Classification Search ............ 117/73, 117/74, 75, 76, 79, 929; 423/446
See application file for complete search history.

(56) References Cited

U.S. PATENT DOCUMENTS 4,287,168 A * 9/1981 Wentorf et al. ............ 423/446
4,617,181 A * 10/1986 Yazu et al. ................. 423/446

* cited by examiner

*Primary Examiner*—Robert Kunemund
(74) *Attorney, Agent, or Firm*—R. Neil Sudol; Henry D. Coleman; William J. Sapone

(57) ABSTRACT

In a diamond manufacturing method, a melt of carbon and blue kimberlite is contained in a vessel at 1000° C. The vessel is pressurized by a gas of predominantly hydrogen to 200 atmospheres. A crystallization seed is drawn from the melt to generate a piece of diamond material.

16 Claims, 1 Drawing Sheet

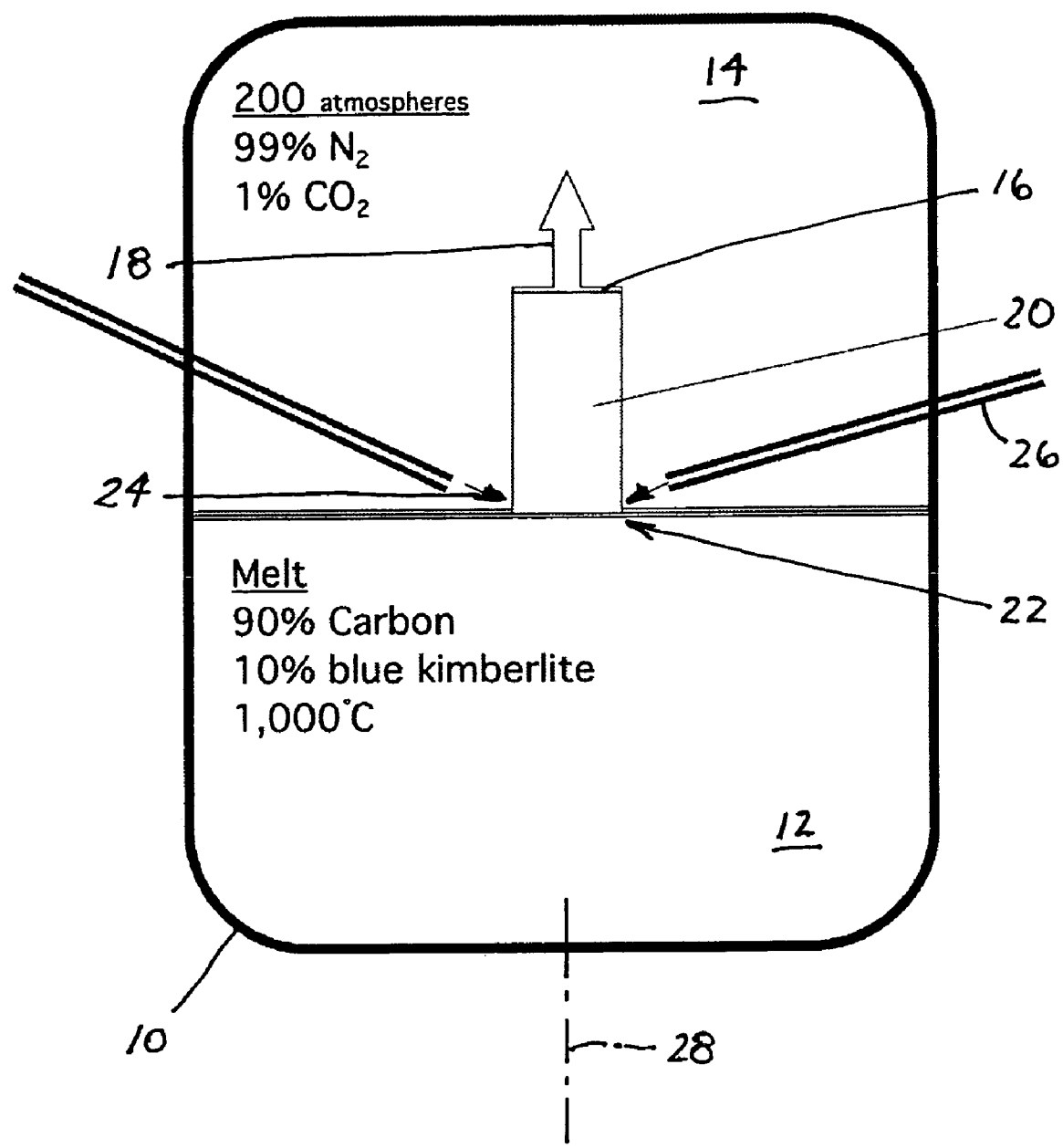

DIAMOND MANUFACTURING METHOD

BACKGROUND OF THE INVENTION

This invention relates to diamond manufacture.

The production of synthetic diamond typically involves enormous pressures and elevated temperatures. The best method, so far, of making small synthetic diamonds involves liquid iron and pressures of around 50,000 atmospheres. Temperatures can be thousands of degrees.

There is a need for a less burdensome, and accordingly, less expensive, method of manufacturing diamond crystals.

OBJECTS OF THE INVENTION

It is an object of the present invention to provide an improved method for manufacturing diamond material.

Another object of the present invention is to provide such a method that involves temperatures and pressures that are reduce relative to those of current manufacturing methods.

A further object of the present invention is to provide a method for manufacturing diamond material, which is less expensive than conventional methods.

These and other objects of the invention will be apparent from the descriptions and drawings herein. Although every object of the invention is believed to be attained in at least one embodiment of the invention, there is not necessarily any single embodiment that achieves all of the objects of the invention.

SUMMARY OF THE INVENTION

A manufacturing method in accordance with the present invention comprises providing a mixture of carbon and blue kimberlite in a melt at an elevated temperature and an elevated pressure, and drawing a crystallization seed from the melt to generate a diamond material. Blue kimberlite is a reduced mica peridotite and is an inexpensive waste product of diamond mining in South Africa. The carbon is basically liquefied coal or charcoal.

Pursuant to another feature of the present invention, the melt is disposed in a pressure vessel that also contains nitrogen gas. Carbon dioxide gas is optionally present in the pressure vessel, preferably in an amount of 1% to 10% of the total gas mixture.

The pressure in the vessel is at least 100 atmospheres and is preferably between 200 and 300 atmospheres. Although higher pressures would not necessarily be ineffective, there appears to be no reason to justify the additional expense.

Pursuant to another feature of the present invention, the melt contains 5% to 50% blue kimberlite and 50% to 95% carbon. Preferably, the melt contains about 10% blue kimberlite and about 90% carbon.

In accordance with a further feature of the present invention, the method additionally comprises directing a jet of cooling gas at a crystallization zone during the drawing of the crystallization seed from the melt. The crystallization zone is the point that the crystallization seed and the ensuing diamond crystal are drawn from the liquid carbon pool. The cooling gas typically has the same composition as the pressurization gas in the vessel. Thus, the cooling gas is preferably mostly, if not entirely, nitrogen gas. Carbon dioxide may be present in amounts up to about 10%, but smaller amounts, in the range of 1% are most preferred.

The temperature of the predominantly carbon melt and the mostly nitrogen gas in the pressure vessel may be in a range of 900° C. to 1500° C. 1000° C. is an effective temperature.

The cooling gas is preferably 100° to 200° cooler than the temperature of the melt (and the nitrogen gas). Thus, where the temperature of the melt is 1000° C., the temperature of the cooling gas is 800° C. to 900° C.

In accordance with a further feature of the present invention, the vessel is rotated to pool a liquid carbon component of the melt at a rotational center of the vessel.

BRIEF DESCRIPTION OF THE DRAWING

The sole FIGURE of the drawing is a schematic cross-sectional view of a pressure vessel used in a method in accordance with the invention.

DETAILED DESCRIPTION

As illustrated in the drawing, a pressure vessel 10 contained a liquefied mixture or melt 12 of 90% carbon and 10% blue kimberlite. Blue kimberlite is a reduced mica peridotite and is an inexpensive waste product of diamond mining in South Africa. The carbon is basically liquefied coal or charcoal.

Vessel 10 also contains a pressurization gas mixture 14 of 99% nitrogen ($N_2$) and 1% carbon dioxide ($CO_2$). The liquefied mixture or melt 12 is maintained at a temperature of 1000° C., while the vessel 10 is pressurized by the predominantly nitrogen gas mixture 14 to a pressure of 200 atmospheres.

A crystallization seed 16 such as a diamond crystal is inserted into the melt 12 and drawn in an upward direction as indicated by arrow 18. During this process, the liquefied carbon atoms of melt 12 crystallize onto the seed 16 to generate a finger 20 of diamond. The speed of withdrawal of the crystalline carbon (diamond) can vary from very slow (e.g., microns per hour) to very quickly (millimeters per minute). Generally, the higher the pull rate, the lower the quality of diamond product generated. Quality will also be affected by the size of a crystallization zone 22 at the point of exit of the crystal finger 20, which is determined in large part by the size of seed 16.

During the crystallization process, one or more jets 24 of a cooling gas are directed at crystallization zone 22 via respective pipes or conduits 26. The cooling gas typically has the same composition as the pressurization gas 14 in vessel 10 and a temperature that is significantly lower. Thus, in the illustrated example, the cooling gas is 99% nitrogen gas and 1% carbon dioxide gas and has a temperature of 900° C.

Vessel 10 may be rotated slowly about a vertical axis to pool a liquid carbon component of melt 12 at a rotational center of the vessel, i.e., along a rotational axis 28 of vessel 10. Crystallization zone 22 is selected to lie along axis 28. The rotating of the carbon and blue kimberlite melt improves the yields of the process. Further improvement may be obtained by using the pure C12 isotope.

In general, a mixture of carbon and blue kimberlite is provided in melt 12 at an elevated temperature and an elevated pressure. A crystallization seed 16 is drawn from the melt 12 to generate a piece of diamond material 20. The melt 12, together with basically nitrogen containing pressurization gas 14, is disposed in pressure vessel 10. Carbon dioxide gas may be optionally provided in an amount of 1% to 10% of the total gas mixture 14.

In general, the pressure in vessel 10 is at least 100 atmospheres and is preferably between 200 and 300 atmospheres.

In general, melt 12 contains 5% to 50% blue kimberlite and 50% to 95% carbon. Preferably, the melt 12 contains about 10% blue kimberlite and about 90% carbon.

The temperature of the predominantly carbon melt and the mostly nitrogen gas in the pressure vessel may be in a range of 900° C. to 1500° C. 1000° C. is an effective temperature. The cooling gas is preferably 100° to 200° cooler than the temperature of the melt (and the nitrogen gas). Thus, where the temperature of the melt is 1000° C., the temperature of the cooling gas is 800° C. to 900° C.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope of thereof.

What is claimed is:

1. A manufacturing method comprising: providing a mixture of carbon and blue kimberlite in a melt at an elevated temperature and an elevated pressure; and drawing a crystallization seed from said melt to generate a diamond material.

2. The method defined in claim 1 wherein said melt is disposed in a pressure vessel also containing nitrogen gas.

3. The method defined in claim 2 wherein said nitrogen gas is contained in said vessel together with said melt at a pressure of at least 100 atmospheres.

4. The method defined in claim 3 wherein said nitrogen gas is contained in said vessel together with said melt at a pressure of 200 atmospheres to 300 atmospheres.

5. The method defined in claim 2 wherein said nitrogen gas is approximately 99% pure.

6. The method defined in claim 5 wherein said pressure vessel also contains carbon dioxide gas.

7. The method defined in claim 6 wherein said nitrogen gas and said carbon dioxide gas are present in proportions of 90% to 99% and 10% to 1%, respectively.

8. The method defined in claim 1 wherein said melt contains 5% to 50% blue kimberlite and 50% to 95% carbon.

9. The method defined in claim 8 wherein said melt contains approximately 10% blue kimberlite and 90% carbon.

10. The method defined in claim 1, further comprising directing a jet of cooling gas at a crystallization zone during the drawing of said crystallization seed from said melt.

11. The method defined in claim 10 wherein said cooling gas includes nitrogen gas.

12. The method defined in claim 11 wherein said cooling gas further includes carbon dioxide gas.

13. The method defined in claim 12 wherein said cooling gas includes nitrogen gas in a proportion of about 90% and carbon dioxide gas in a proportion of about 10%.

14. The method defined in claim 1 wherein said elevated temperature is in a range of 900° C. to 1500° C.

15. The method defined in claim 14, further comprising directing a jet of cooling gas at a crystallization zone during the drawing of said crystallization seed from said melt, said cooling gas being 100° to 200° cooler than said elevated temperature.

16. The method defined in claim 1 wherein said melt is disposed in a pressure vessel, further comprising rotating said vessel to pool a liquid carbon component of said melt at a rotational center of said vessel.

\* \* \* \* \*